United States Patent

Kordina et al.

[11] Patent Number: 5,879,462
[45] Date of Patent: Mar. 9, 1999

[54] DEVICE FOR HEAT TREATMENT OF OBJECTS AND A METHOD FOR PRODUCING A SUSCEPTOR

[75] Inventors: Olle Kordina, Sturefors; Willy Hermansson, Västerås; Marko Tuominen, Linköping, all of Sweden

[73] Assignees: ABB Research Ltd., Zurich, Switzerland; Okmetic Ltd., Espoo, Finland

[21] Appl. No.: 543,628

[22] Filed: Oct. 16, 1995

[51] Int. Cl.[6] ............ C23C 16/00; C03B 25/00; H05B 6/10; F27B 5/04

[52] U.S. Cl. ............ 118/725; 117/951; 219/634; 432/205; 432/241

[58] Field of Search ............ 118/725; 117/951; 219/634, 759; 432/241, 205

[56] References Cited

U.S. PATENT DOCUMENTS

| | | | |
|---|---|---|---|
| 2,743,306 | 4/1956 | Mark | 219/634 |
| 2,901,381 | 8/1959 | Teal | 118/725 |
| 3,125,416 | 3/1964 | Ryshkewitch et al. | 117/87 |
| 3,343,920 | 9/1967 | Lowe | 118/725 |
| 4,263,872 | 4/1981 | Ban | 118/721 |
| 4,321,446 | 3/1982 | Ogawa | 219/634 |
| 5,433,167 | 7/1995 | Furukawa et al. | 117/84 |
| 5,441,011 | 8/1995 | Takahashi | 117/84 |

FOREIGN PATENT DOCUMENTS

| | | | |
|---|---|---|---|
| 899255 | 5/1945 | France | 219/634 |
| 496462 | 4/1930 | Germany | 219/634 |
| 570290 | 1/1933 | Germany | 219/634 |
| 32 30 727 | of 1987 | Germany . | |
| 862600 | 3/1961 | United Kingdom | 117/951 |

OTHER PUBLICATIONS

Kordina et al., A Novel Hot–Wall CVD Reactor For SiC Epitaxy, Inst. Phys. Conf. Ser. No. 137, Chapter I, Paper presented at the 5th SiC and Related Materials Conference, Washington, DC 1993 pp. 41–44.

*Primary Examiner*—Richard Bueker
*Assistant Examiner*—Jeffrie R. Lund
*Attorney, Agent, or Firm*—Pollock, Vande Sande & Priddy

[57] ABSTRACT

The present invention is directed to a device for heat treatment of objects. It comprises a susceptor for receiving an object in the form of a substrate and a gas mixture fed to the substrate for epitaxial growth of a crystal on said substrate by Chemical Vapor Deposition. The susceptor includes an inner wall and an outer, circumferential wall enclosing the inner wall at a distance therefrom. The inner wall defines a chamber for receiving the object. An enclosed space is formed between the inner and outer wall, and is filled with a powder. The powder is made of SiC, a group III nitride or alloys thereof. Also, for heating the susceptor and thereby also the object, a Rf-field radiator is provided surrounding the susceptor.

15 Claims, 2 Drawing Sheets

DEVICE FOR HEAT TREATMENT OF OBJECTS AND A METHOD FOR PRODUCING A SUSCEPTOR

FIELD OF THE INVENTION AND PRIOR ART

The present invention relates to a device for heat treatment of an object comprising a susceptor adapted to receive an object and means for heating the susceptor and thereby the object itself as well as a method for producing a susceptor.

BACKGROUND OF THE INVENTION

The invention relates to all kinds of heat treatment of objects in which an object is received in a susceptor and heated by heating the susceptor. Devices presently known for such heat treatments involve a number of problems, which may, by way of a non-limitative example, be illustrated in the case of epitaxially growing crystals, i.e. single crystals, by Chemical Vapor Deposition (CVD). Furthermore, the problems commonly encountered in growing crystals by CVD will be discussed below for the particular case of growing crystals of SiC, but similar results can be obtain for growing crystals of other materials, such as, in particular, Group III-nitrides and all types of alloys of such nitrides and/or SiC. This growth is mostly carried out while, at the same time, intentionally doping the object grown.

SiC single crystals are, in particular, grown for use in different types of semiconductor devices, such as for example different types of diodes, transistors and thyristors, which are intended for applications in which it is possible to benefit from the superior properties of SiC in comparison with especially Si, namely the capability of SiC to function well under extreme conditions. The large bandgap between the valance band and the conduction band of SiC makes devices fabricated from Sic material operable at high temperatures, namely up to 1000° K.

However, high temperatures are needed for obtaining a good, orderly growth. The epitaxial growth of silicon carbide by Chemical Vapor Deposition is therefore carried out in a temperature regime in excess of 1400° C. These high temperatures are needed both to obtain decomposition by cracking of Si- and C-containing precursor gases of the gas mixture used for the CVD, and to ensure that the atoms are deposited on the surface of the substrate on which the crystal is grown in an ordered manner. However, high temperatures also present problems, such as having impurities coming out of different types of material, so that the temperature could not, until now, for the growth of SiC be raised above a temperature interval of 1400°–1700° C., necessarily resulting in a rather low growth rate (some $\mu$m per hour) so that it is impratical to grow boules for forming i.e. substrates, by using CVD. Consequently, this method is only used for growing objects in the form of layers. However, it is even possible to grow layers of SiC by CVD through devices already known at such a high growth rate that a commercial production thereof becomes commercially interesting.

A raise of the temperature for increasing the growth rate could, until the present, not be used, since this would result in rapid degradation of the walls of the susceptor due to increased etching of hot spots thereof, leading to an unacceptable incorporation of impurities therefrom into the grown layers.

As already mentioned, it is, due to the low growth rates, impossible to grow boules, which require growth rates in the order of millimeters per hour, by CVD. Consequently the seeded sublimation technique is presently used for growing boules, which may then be sliced to substrates. However, the crystalline quality of the boules grown by this technique is low in comparison with that of the SiC layers epitaxially grown by CVD. The substrates so produced are perforated with small holes called micropipes or pinholes, which limit the device area considerably which consequently make high-power devices of SiC not commercially practical. In the seeded sublimation technique the source is a SiC powder that sublimes, whereupon the gas species are transported by a temperature gradient to the seed crystal where the growth occurs. The conditions in the gas phase are governed by thermodynamics only, which makes it difficult to keep the C/Si ratio constant due to Si vapor leakage out of the system. Furthermore, the purity of the gases used for Chemical Vapor Deposition are several orders of magnitude higher than that of the source material used for seeded sublimation growth.

The prior art includes devices using susceptors of graphite, which contain major amounts of unwanted impurities with a tendency to be released and deposited on the crystal grown when the susceptor is heated. This problem has been partially solved by applying a SiC-coating on the susceptors and, additionally, a plate of SiC can be placed underneath the substrate. However, after a while the SiC-coating of the susceptor may be removed, especially by etching, and impurities are introduced into the gas-phase. Cracks in the SiC-coating may also be produced due to stresses arising between the different materials, namely SiC and the graphite, as a result of temperature changes.

In most cases when other crystals than SiC are grown the temperature is lower and therefore the impurity problems due to high temperatures are not as accentuated as for SiC, but the problems with etching of the susceptor or protective coating thereof, resulting in cracks of such a coating thus remain.

As already mentioned, the invention is applicable to all types of heat treatments of this kind. The problem that the susceptor sets an upper limit for the temperature that may be used for the heat treatment as well as the problem with impurities coming out from the susceptor are in common therefore.

SUMMARY OF THE INVENTION

An object of the present invention is to provide devices of the type defined above that enable the disclosed so that such heat treatments may be carried out at higher temperatures and/or with less impurity problems.

This object is, in accordance with the invention, obtained by providing such a device with a susceptor that comprises an inner and an outer circumferential wall forming a closed space therebetween, the inner wall of which defines a room for receiving the object, and that the closed space is filled with a powder. As a result of the arrangement of the powder within the space there will, in the case discussed above of growing SiC by CVD, be any risk of occurance of cracks at the inner surface of the susceptor as in the case of graphite coated by SiC. Furthermore, when a Rf-field radiating means is used for heating the susceptor, which is usually the case, the Rf-field will couple very well with that powder and efficient heating will be accomplished.

The major advantage of this device is the possibility of raising the temperature without formation of irregularities of the temperature distribution of the walls of the susceptor independent of the cross section shape thereof if a powder with sublimation capacity is used and the heat treatment is carried out by heating the susceptor at a temperature above the sublimation temperature of the powder. In such cases, if there is a hot-spot on the susceptor for example due to a thinner thickness of the susceptor wall there, the powder will sublime and be deposited at a colder spot. Due to the smaller amount of powder at the hot-spot, the Rf-coupling will decrease at this point and the temperature will be lowered until the temperature is uniform again. In this way, very uniform heating can be accomplished which adapts itself to external circumstances (gas flow, external;cooling etc). This means that it will be possible to raise the temperature without any further measures in comparison to already known susceptors, so that the temperature for the entire susceptor may be raised to, and above, a level which the hot-spots had in the susceptors according to the prior art without giving rise to additional problems resulting from incorporation of impurities from the susceptor walls into the object grown, which in the case of growing crystals of SiC by Chemical Vapor Deposition means the possibility of growing such crystals of high quality with a considerably higher growth rate than before, so that it is possible and advantageous to grow boules of SiC by using the CVD-technique and the advantages thereof in comparison to the seeded sublimation technique.

According to a preferred embodiment of the invention, the device is adapted for heating an object in the form of a substrate and a gas mixture fed to the substrate for epitaxial growth of a crystal on said substrate by Chemical Vapor Deposition. This embodiment has the advantages discussed above, and these are especially present when crystals of SiC, a Group III-nitride, or alloys thereof are grown.

According to a further preferred embodiment of the invention, the walls on the susceptor are made of SiC, an alloy of SiC and the material grown, or the grown material itself. Therefore, the walls of the susceptor may not release any material which may detrimentally influence the growth of the crystal.

According to a preferred embodiment of the invention, at least the inner wall of the susceptor is made of SiC. This constitutes a great advantage since SiC is a material forming an excellent diffusion barrier, so that it is very useful as a material for the susceptor wall, also when crystals other than SiC are grown, for e.g. crystals of AlN.

According to another preferred embodiment of the invention, the powder is made of SiC, an alloy of SiC with the material grown, or the material grown itself, which means that it will not be harmful even if there were a diffusion of material through the susceptor walls or a crack therein, which in any way will not result.

According to another preferred embodiment of the invention, the powder is selected from a group of materials having a sublimation capacity and a sublimation temperature which is lower than the temperature at which the susceptor walls are intended to be heated by the heating means due to its growth. This will, as discussed further above, result in a uniform temperature of the susceptor walls thereby making it possible to use higher temperatures and thereby achieve higher growth rates and even the possibility to use the Chemical Vapor Deposition technique to grow boules, in particular of SiC.

The invention also comprises a device for heat treatment of an object comprising a susceptor adapted to receive an object and means for heating the susceptor and thereby the object, which is characterized in that the susceptor is made of SiC powder heat treated to the shape of the susceptor. Such a susceptor will, due to the nature of SiC, have no tendency to release any impurities even at very high temperatures, so that it is especially well suited for such heat treatment in the form of growing crystals of, in particular, SiC by Chemical Vapor Deposition at high temperatures, so that such growth may take place at higher temperatures than used before and thereby higher growth rates may be achieved, so that even the CVD technique may be used for growing boules.

According to a preferred embodiment of the device last mentioned according to the invention, the susceptor is made of SiC powder excerted to hot isostatic pressing to the shape of the susceptor. A susceptor manufactured in this way is compact and strong with no blisters therein. This manufacturing technique also makes it possible to produce the susceptor in one step without the need of any further treatment afterwards. Furthermore, the invention also comprises a method for producing a susceptor in this advantageous way.

According to a preferred embodiment of the invention, the device is adapted for growing layers which may be grown at a higher temperature and, thereby, with a higher growth rate than before, or at the same temperature as before but with less impurity problems.

According to a still further preferred embodiment of the invention, the device is adapted for growing boules and the substrate is a seed crystal. This is, as mentioned above, possible due to the higher temperatures possible as a consequence of the construction of the susceptor, so that the boules having a superior crystalline quality to that obtained by using the seeded sublimation technique may be obtained at commercially high growth rate through the High Temperature Chemical Vapor Deposition (HTCVD) according to the invention.

Further preferred features and advantages of the device and the method according to the invention will appear from the following description of the other dependent claims.

BRIEF DESCRIPTION OF THE DRAWINGS

With reference to the appended drawings, a specific description of a preferred embodiment of the invention is cited as an example.

In the drawings.

DETAILED DESCRIPTION OF PREFERRED EMBODIMENTS OF THE INVENTION

Figure 1:
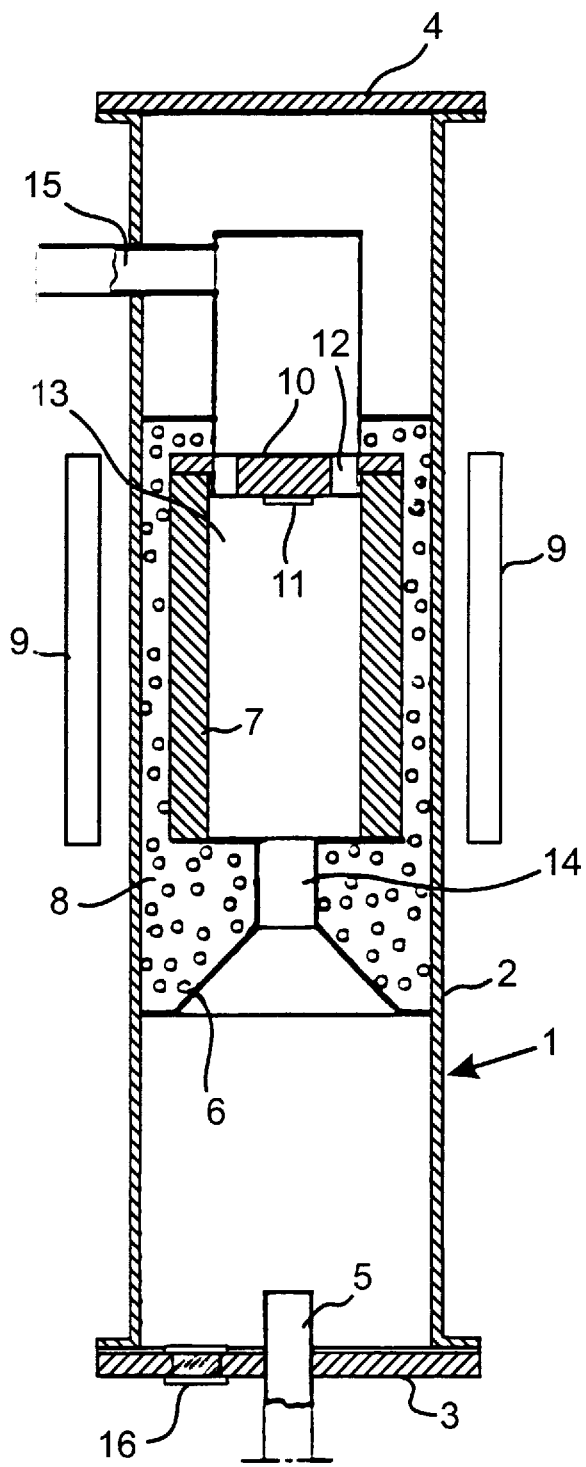
FIG. 1 is a longitudinal cross-section view showing a device for epitaxially growing crystals, especially of SiC, by Chemical Vapor Deposition, in which a device according to the invention may be incorporated.

FIG. 1 shows schematically a device for epitaxially growing crystals, especially of SiC, by Chemical Vapor Deposition on a SiC-substrate in a simplified manner. Obviously, this device also comprises other means, such as pumps. The device according to the invention may be incorporated in a device of this kind and this device will therefore be described for better understanding of the invention and the problems solved thereby.

The device shown in FIG. 1 comprises a vacuum casing 1 comprising a tube 2 of quartz extending substantially vertically and two opposite end flanges 3 and 4. A conduit 5 for supplying a stream of a gas mixture intended for the growth of a crystal is introduced through the lower end flange 3. The conduit 5 is connected to separate conduits leading to sources for the respective components of the gas mixture and these conduits are provided with flow regulating means, not shown, for regulating the content of each component in the gas mixture as desired.

Furthermore, the device comprises a funnel 6 for concentrating the gas flow from the conduit 5 into a susceptor 7. The space surrounding the susceptor is enclosed and filled by graphite foam 8 for thermal insulation for protecting the surrounding quartz tube 2. Rf-field radiating means 9 in the form of a Rf-coil surrounds the tube 2 along the longitudinal extension of the susceptor 7. This heating means 9 is arranged to radiate a Rf-field uniformly heating the susceptor and thereby the gas mixture introduced into the susceptor.

The susceptor 7 comprises a lid 10, on the lower side of which a SiC substrate 11 is arranged and which may be removed from the rest of the susceptor so as to remove the substrate after a crystal has been grown thereon. The lid 10 is provided with peripheral gas outlet holes 12, so that a preferable laminar gas flow will enter the susceptor room 13 through the lower inlet 14 and flow close to the substrate and leave the susceptor through the upper outlets 12, and then the device through a conduit 15 connected to a pump not shown. Due to the fact that the gas outlets are in the same end of the susceptor as the substrate, this susceptor will be most suited for growing layers, but it can also be used for growing boules as long as the dimensions thereof are not so great that they obstruct the outlets. For growing boules, the outlets are preferably made at the opposite end of the susceptor.

The temperature inside the susceptor 7 may be checked pyrometrically by looking into the susceptor 7 through a window indicated at 16.

The general function of this device is as follows: a gas mixture including Si- and C-containing precursor gases and one or more carrier gases is led through the conduit 5 in the direction of the susceptor inlet 14. The Si-containing precursor gas is preferably silane, while the C-containing precursor gas is propane or eventually methane. The carrier gas may be $H_2$, but there may also be a content of a non-etching carrier gas, such as Ar therein. The heating means 9 heats the susceptor walls through which the precursor gases entering the susceptor will be heated and cracked into Si- and C-atoms, which will be transported to the substrate 11 and deposited thereon for epitaxially growing layers of SiC thereon.

Figure 2:
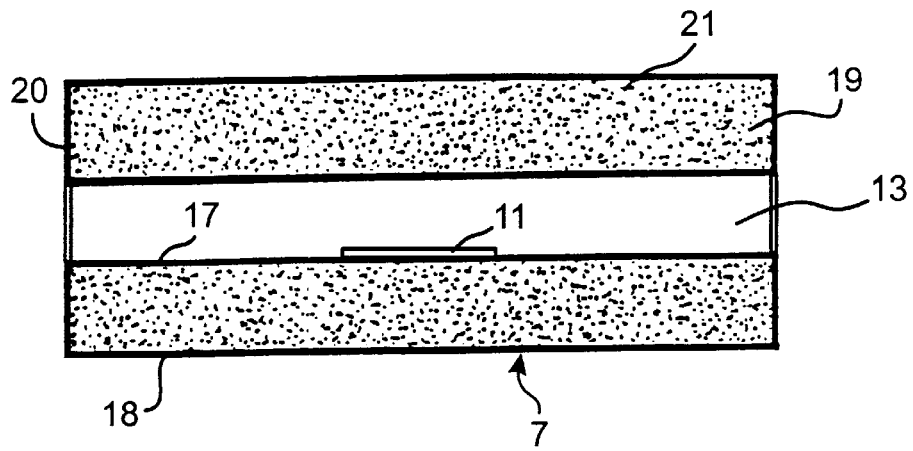
FIG. 2 is a longitudinal cross-section view of a device according to a first preferred embodiment of the invention.
Figure 3:
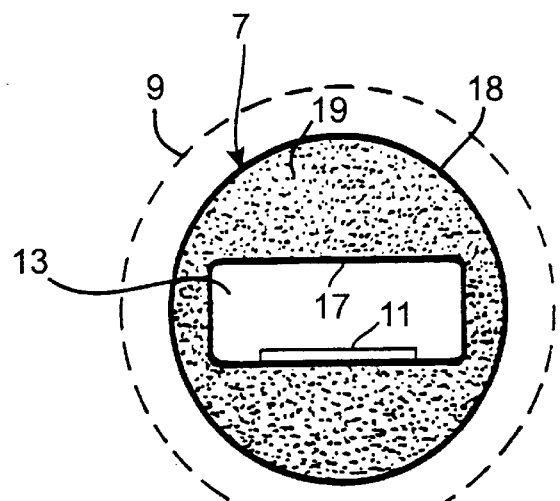
FIG. 3 is an end view of the device according to FIG. 2.

The present invention resides particularly in the construction of a susceptor suitable for use in a device of the type described above and shown in FIG. 1, although the invention also comprises susceptors for other types, in principle all types, of heat treatment. A susceptor according to a preferred embodiment of the invention is shown in FIGS. 2 and 3. This has an inner 17 and an outer 18 circumferential wall forming a closed space 19 therebetween. The inner wall 17 defines a room 13 for receiving a substrate 11 to be heated by heating of the susceptor walls. The space 19 is sealed at the end by end walls 20. The inner and outer walls 17 and 18, respectively, are preferably formed by a tube, and the space 19 is sealed at the ends by circular plates having a recess, in this case substantially rectangular, corresponding to the cross section of the tube forming the inner wall 17. Plates 20 may be glued to the tubes with, for instance, molten sugar. The space 19 is filled with a powder 21. The walls of the susceptor are thin with respect to the distance therebetween, and typical dimensions are that the susceptor has an internal diameter of 30 mm, a wall thickness of 0.3–2 mm and a distance between the walls of 15 mm.

In the case of growing a crystal of SiC, a Group III-nitride or alloys thereof, the walls 17 and 18 are preferably made of SiC, an alloy of SiC with the material grown, or the material grown. The end walls are preferably of the same material as the walls.

When a crystal of SiC is grown, it is most preferred that walls 17, 18 and 20 are made of SiC. The powder 21 may be made of SiC, an alloy of SiC and the material grown, when a crystal of SiC, a Group III-nitride, or alloys thereof, is grown by Chemical Vapor Deposition, and it is most preferable of SiC when SiC is grown.

The function of the device shown in FIGS. 2 and 3 is the following when a crystal of SiC is grown on the substrate 11. The Rf-heat radiating means 9, indicated by the dashed line in FIG. 3, surrounding the susceptor heats the susceptor by radiating a Rf-field, and this field couple very well to the powder 21 of SiC. Due to the fact that there will be no stresses between the powder and the walls of the susceptor, there is no risk of formation of cracks in the walls, so that the quality of the powder may be comparatively low. This in its turn, makes the Rf-field couple better to the powder. Accordingly, heating of the susceptor will take place in an efficient way, so that high temperatures may easily be achieved.

If the susceptor is heated above the temperature at which the SiC powder starts to sublime to a considerable extent, i.e. above approximately 1800° C., this powder will see to that the susceptor walls will get a uniform temperature. If there is a hot-spot, the powder will sublime and be deposited at a colder spot. Due to the smaller amount of powder at the hot-spot, the Rf-coupling will decrease at this point and the temperature will be lowered until the temperature is uniform again.

Temperatures above 1900° C. and in particular temperatures used when boules of SiC are produced by a conventional seeding sublimation technique, i.e. temperatures of 2000° C.–2500° C., may be obtained when using this susceptor without any introduction of excessive amounts of impurities into the grown crystal. Thus, such high growth rates may be achieved, that it is commercially interesting to grow both layers and boules by using this so called High Temperature Chemical Vapor Deposition technique.

Figure 4:
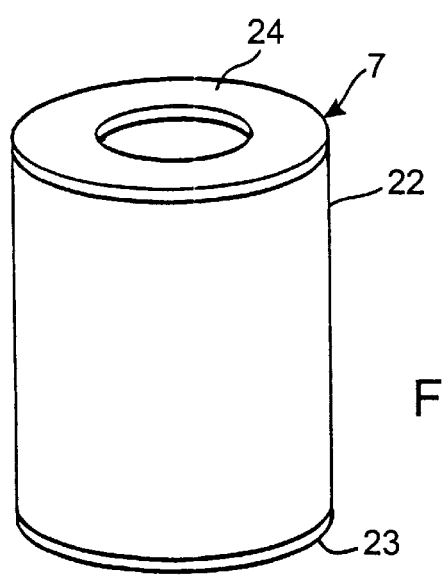
FIG. 4 is a perspective view of a device for heat treatment of objects according to a second preferred embodiment of the invention.

FIG. 4 shows a device according to a second preferred embodiment of the invention in the form of a cylindrical container 22 for heat treatment of objects, which is made of two concentric tubes of the type in the embodiment according to FIGS. 2 and 3 and a powder in the space confined therebetween. This container 22 has a bottom 23 of SiC glued with molten sugar to the two tubes and at the other end a ring 24 of SiC, which may also be glued with molten sugar to the tubes. Such a container may be used for all types of heat or thermal treatment of samples or anything else. It is emphasized that the powder may be of any material, but that it is particularly advantageous to use a powder of a material which will sublime at a temperature lying below the temperature at which the heat treatment is intended to take place, so that a perfect uniformity of the temperature of the susceptor will be obtained.

Figure 5:
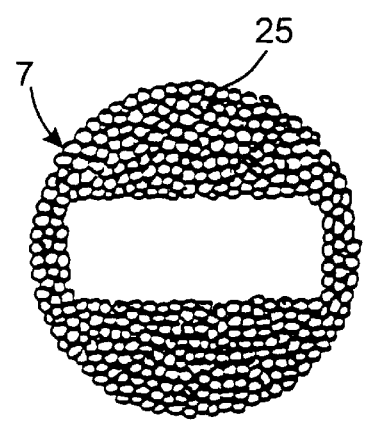
FIG. 5 is an end view of a device according to a third preferred embodiment of the invention.

FIG. 5 shows a cross section view of a device according to a third preferred embodiment of the invention, and this susceptor has substantially the same cross section as the susceptor according to FIGS. 2 and 3. However, this susceptor is made of a single uniform wall 25 of SiC and has been produced by hot isostatic pressing (HIP) of SiC powder to this shape with appropriate equipment, through which it was possible to bring the individual granules of the powder to be bound strongly to each other without any blisters therebetween, so that a compact and very strong susceptor is obtained in one single step without any need of further treatment afterwards. This, in the case of SiC, would be very difficult due to the specific characteristics, such as hardness, of SiC. Accordingly, a susceptor made of SiC may, in this way, be obtained easily and at low cost, since SiC does not have to be machined.

It should be noted, that the size of the individual granules of the susceptor of FIG. 5 has been enormously exaggerated for better explaining the invention. A susceptor of this kind may be heated to very high temperatures without causing any impurity problems in the heating process, such as when, for instance, a SiC crystal is epitaxially grown by Chemical Vapor Deposition.

The invention is not in any way restricted to the preferred embodiments of the device and method described above, but several possibilities to modifications thereof are apparent for one skilled in the art without departing from the basic idea of the invention.

All definitions concerning the material of course include inevitable impurities as well as intentional doping. The susceptor may have different shapes and dimensions than shown in the Figures.

The claim definition "a material not influencing the object at the temperature at which the heat treatment is intended to take place" includes a material not influencing the object because it will not itself be deposited on the object or release impurities depositing on the object as well as because it is the same as that of the object that is being treated, so that it will not be harmful if it is deposited on the object or the crystal grown thereon.

We claim:

1. A device for heat treatment of objects, comprising:
  a susceptor for receiving an object in the form of a substrate and a gas mixture fed to the substrate for epitaxial growth of a crystal on said substrate by Chemical Vapor Deposition;
  the susceptor including an inner wall and an outer circumferential wall enclosing said inner wall at a distance therefrom, the inner wall defining a chamber for receiving said object;
  a closed space formed between said inner and outer wall, and filled with a powder, said powder being made of SiC, a group III nitride or alloys thereof; and
  means for heating the susceptor and thereby also said object, said heating means being a Rf-field radiating means surrounding said susceptor.

2. A device according to claim 1, wherein said walls are thin and the distance between said inner and outer walls is considerably greater than the thickness thereof.

3. A device according to claim 1, wherein each said wall is formed by a tube and said space is closed at the ends of the tubes by plates.

4. A device according to claim 1, wherein said walls are made of a material not influencing the object at the temperature at which said heat treatment is to take place.

5. A device according to claim 1, wherein said walls of the susceptor are made of SiC, an alloy of SiC and the material being grown in the susceptor, or the material grown in the susceptor.

6. A device according to claim 5, wherein at least the inner wall of the susceptor is made of SiC.

7. A device according to claim 1, wherein said walls and said powder are made of SiC.

8. A device according to claim 1, wherein said powder is selected from a group of materials having sublimation capacity and a sublimation temperature lower than the temperature at which the susceptor walls are to be heated by said heating means during said growth.

9. A device according to claim 1, wherein said device is to be used for growing crystals of SiC, a Group III-nitride or alloys thereof.

10. A device according to claim 1, wherein said device is adapted for growing boules and said substrate is a seed crystal.

11. A device according to claim 1, wherein said device is adapted for growing layers.

12. A device according to claim 1, wherein said device is adapted for growing crystals of SiC.

13. A device according to claim 12, wherein said heating means is arranged to heat the susceptor walls to a temperature of above 1900° C.

14. A device according to claim 1, wherein the walls of the susceptor form a substantially cylindrical susceptor.

15. A device according to claim 1, wherein the chamber of the susceptor intended for receiving said object has a substantially rectangular cross section.

* * * * *